PRECISION MASKING USING SILICON NITRIDE AND SILICON OXIDE

Filed June 17, 1968

INVENTOR
R. J. JACCODINE
BY H. W. Lockhart

ATTORNEY 3,592,707

PRECISION MASKING USING SILICON NITRIDE AND SILICON OXIDE

Ralph J. Jaccodine, Allentown, Pa., assignor to Bell Telephone Laboratories, Incorporated, Murray Hill, N.J.

Filed June 17, 1968, Ser. No. 737,533
Int. Cl. C23c *11/06;* H01l *7/44*
U.S. Cl. 156—17 1 Claim

ABSTRACT OF THE DISCLOSURE

A silicon oxide mask defines the diffusion of a conductivity type zone in a semiconductor body. The surface of the diffused zone then is covered by a layer of silicon nitride which is selectively etched using phosphoric acid. This etchant removes the peripheral portions leaving a central portion of silicon nitride. The semiconductor body then is treated to replace the removed silicon nitride with silicon oxide after which the remaining central portion of silicon nitride is removed, leaving a window to the semiconductor body surface which is registered with respect to the diffused zone and of fine dimensions determined by the etching process.

BACKGROUND OF THE INVENTION

Figure 1:
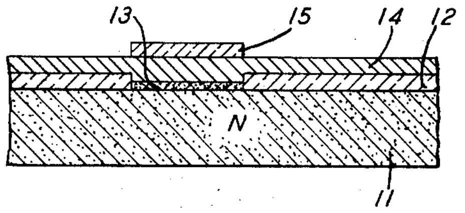

This invention relates to semiconductor devices and, more particularly, to a fabrication technique for forming a self-registered, dimensionally-controlled window in a dielectric mask.

Current semiconductor technology, both for discrete and integrated circuit devices, commonly includes the planar technique utilizing photoresist oxide masks and solid state diffusion. Structures of considerable complexity are fabricated using a succession of masking and diffusion steps followed by the deposition of metallic patterns comprising the interconnections. Even this latter step involves the use of masking operations similar to those used throughout this entire procedure. The ultimate efficiency of the fabrication process depends, to a considerable extent, upon the precise registration and reregistration of the successive masks. It is well known that dimensional control of the order of a few microns or even tenths of microns for the higher frequency devices is required.

Not only is the precise location of mask windows of importance but the effort to reduce their size to minimal dimensions is significant to the electrical response of the device. This element of definition reaches practical limits particularly for techniques based on the photographic processes.

In accordance with this invention a method is provided for forming a contact window, the location and size of which may be independent of the location and dimensions of a mask. Thus, an object of this invention is to facilitate the fabrication of semiconductor devices capable of somewhat higher frequency characteristics as well as to facilitate the fabrication of devices of more general performance.

In accordance with this invention the formation of a conductivity type zone in a semiconductor body by solid state diffusion by any of the well-known means including directly from the vapor state or predeposition and drive-in, is followed by the formation on the surface of the diffused zone of a coating of a dielectric having a differing etch response from silicon oxide. Typically, a suitable dielectric is silicon nitride which is attacked by phosphoric acid from which silicon oxide is relatively immune. The structure then is etched in phosphoric acid and by proper timing the process may be controlled so as to result in removal of the peripheral portions of the silicon nitride coating leaving a central portion, the dimensions of which will correspond to the ultimate mask window subsequently produced.

Following this etching step the structure is treated to form a silicon oxide coating in the areas where the silicon nitride has been removed. Finally, a second phosphoric acid etch removes the central portion of silicon nitride leaving a window in the mask to the semiconductor body beneath. The window is automatically registered with the underlying diffused zone, and may be of extremely small dimensions by timing the etching process. Thus, a feature of the process is the elimination of at least one precision mask registration step.

The invention and its other objects and features will be better understood from the following detailed description taken in conjunction with the drawing in which FIGS. 1 through 7 are partial cross sections of a portion of a semiconductor body during the successive steps of a portion of the fabrication of a semiconductor device in accordance with this invention.

Referring to FIG. 1 of the drawing, initial fabrication steps have been taken with respect to a body 11 of N type single crystal silicon. These steps include the formation of a silicon dioxide mask 12 on a portion of the surface of the body 11 in which a predeposited layer 13 of silicon oxide containing a suitable impurity for diffusion has been formed on the remaining portion of the surface. Overlying the entire first layer portions 12 and 13 is a layer 14 of silicon nitride. Finally, overlying the silicon nitride layer 14 in register with the predeposited layer 13 is a partial silicon dioxide layer 15. This partial layer of silicon oxide 15 is formed by well-known photoresist masking techniques using a hydrofluoric-nitric acid etch which is, in effect, self-terminating inasmuch as it does not attack the underlying silicon nitride layer 14 to any substantial extent.

All of the foregoing dielectric layers are formed using techniques now well-known in the art. The initial silicon dioxide layer 12 may be produced either by a thermal process or by deposition using any one of several techniques including the cracking of organic compounds such as silane or direct vapor deposition processes for the deposition of silicon nitride utilizing proportionation techniques involving mixtures of ammonia and a silicon compound are well known. The silicon dioxide layer 15 obviously must be formed by a deposition process rather than by a growth technique.

Figure 2:
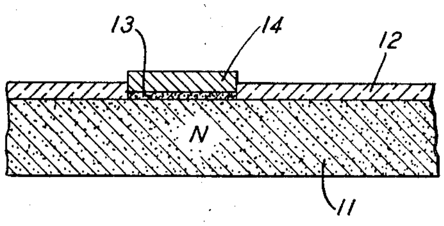

The structure shown in FIG. 1 then is subjected to a hot phosphoric acid etch which removes the portion of the layer 14 not masked by the silicon dioxide layer 15 and produces the configuration shown in FIG. 2. Procedures for accomplishing this etching step are disclosed in the application of A. A. Bergh and W. Van Gelder, Ser. No. 541,173, Apr. 8, 1966, now Pat 3,479,237, issued Nov. 18, 1969, assigned to the assignee of this application. At this point, the diffusion heat treatment is accomplished to form the P type conductivity zone 16 by diffusion of the impurity which typically may be boron contained in the predeposited layer 13.

Figure 3:
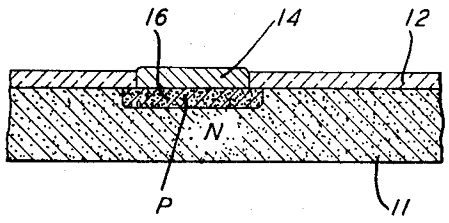

The structure then is as shown in FIG. 3 and comprises essentially a silicon nitride layer 14 over substantially the surface of P type zone 16 with the remainder of the surface covered by a silicon oxide layer 12.

Figure 4:
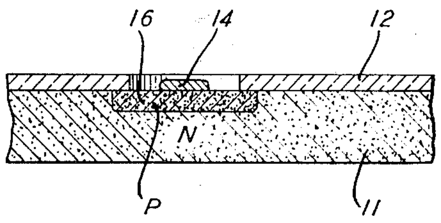

Referring to FIG. 4, another etching treatment in phosphoric acid causes a selective attack upon the silicon nitride coating 14 and reduces this coating to a central portion as shown. Inasmuch as the etching proceeds from two sides as well as from the top of the silicon nitride coating the shaping of this dielectric layer follows the configuration shown. The rate of etching is sufficiently well known to enable the relatively precise timing of this etching process so as to produce a silicon nitride portion 14 having dimensions corresponding to those desired for the mask window ultimately being fabricated.

Figure 5:
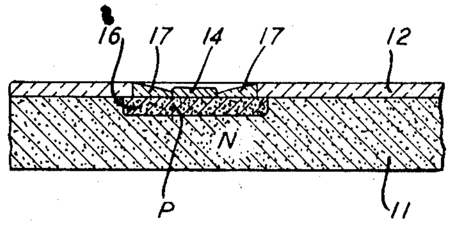

Following this controlled etching operation the structure is treated again to provide a coating of silicon dioxide 17 in the areas from which silicon nitride has been removed. Typically, if the semiconductor material is silicon, a thermal process may be used conveniently to reform this silicon oxide layer. Otherwise, a deposition process, without masking, may be used covering the entire area. In such case the next described etching step will lift out the underlying silicon nitride like a parting layer. The reformed silicon oxide coating 17 is shown in FIG. 5.

Figure 6:
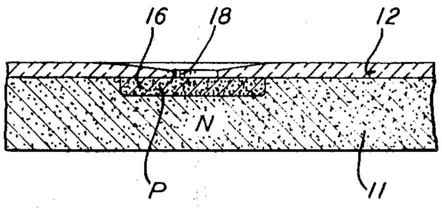
Figure 7:
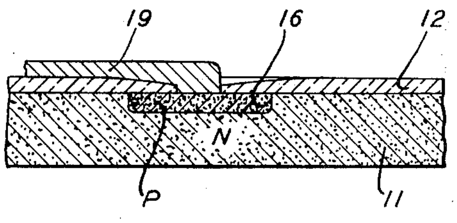

Next, referring to FIG. 6, a second selective etch process using phosphoric acid removes the central portion 14 of silicon nitride leaving the window 18 to the underlying semiconductor body through the oxide mask 17–12. This window is properly aligned with the underlying diffused zone and may be of extremely small dimensions generally exceeding the definition achieved with photographic and optical methods. Once formed, the window 18 may be used for any one of several fabrication steps and typically as shown in FIG. 7 may provide a window for forming a deposited metal contact 19 to the underlying semiconductor material.

Although the invention has been disclosed in terms of particular dielectric silicon oxide and silicon nitride and a particular semiconductor, slicon, it is obvious that other equivalent materials may be utilized subject only to the requirement that there be a differing etch response as to the two dielectrics and of course the semiconductor material itself. For example, aluminum oxide may be used in place of silicon nitride as disclosed in the above-noted patent of Bergh and Van Gelder. Accordingly, it will be understood that other arrangements may be devised which will be within the scope and spirit of the invention.

What is claimed is:

1. A process for forming a window in a dielectric mask on a silicon semiconductor surface comprising:

(a) forming a layer of silicon oxide having first window therein on the surface of a silicon semiconductor body, (b) depositing in said window and on said silicon oxide a layer of a dielectric selected from the group consisting of silicon nitride and aluminum oxide, (c) forming on said dielectric layer a partial layer of silicon oxide conforming to said window, (d) treating said body with hot phosphoric acid for a period of time sufficient to remove the peripheral portions of said dielectric layer not covered by said partial silicon oxide layer leaving the dielectric layer in said window, (e) treating said body with hot phosphoric acid to remove peripheral portions of said dielectric layer in said window, (f) replacing said removed peripheral portions with silicon oxide, (g) treating said body with hot phosphoric acid to remove the remaining central portion of said dielectric layer thereby providing a second window of smaller dimensions than said first window and in registry therewith.

References Cited

UNITED STATES PATENTS

| | | | |
|---|---|---|---|
| 3,437,533 | 4/1969 | Dingwall | 148—187 |
| 3,462,657 | 8/1969 | Brown | 317—235 |
| 3,475,234 | 10/1969 | Kerwin et al. | 148—189 |
| 3,477,886 | 11/1969 | Ehlenberger | 148—187 |

ROBERT F. BURNETT, Primary Examiner

R. J. ROCHE, Assistant Examiner

U.S. Cl. X.R.

29—578, 590; 148—187; 117—215